(12) United States Patent
Leahy et al.

(10) Patent No.: US 10,553,545 B2
(45) Date of Patent: Feb. 4, 2020

(54) ELECTROMAGNETIC SHIELDING FOR INTEGRATED CIRCUIT MODULES

(71) Applicant: Qorvo US, Inc., Greensboro, NC (US)

(72) Inventors: Donald Joseph Leahy, Kernersville, NC (US); James E. Culler, Jr., Lexington, NC (US); Thomas Scott Morris, Lewisville, NC (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 15/825,948

(22) Filed: Nov. 29, 2017

(65) Prior Publication Data

US 2018/0204804 A1 Jul. 19, 2018

Related U.S. Application Data

(60) Provisional application No. 62/447,104, filed on Jan. 17, 2017.

(51) Int. Cl.
| | |
|---|---|
| *H01L 23/552* | (2006.01) |
| *H01L 21/3205* | (2006.01) |
| *H01L 21/683* | (2006.01) |
| *H01L 21/78* | (2006.01) |
| *H01L 23/48* | (2006.01) |
| *H01L 21/288* | (2006.01) |

(Continued)

(52) U.S. Cl.
CPC .......... *H01L 23/552* (2013.01); *H01L 21/288* (2013.01); *H01L 21/2885* (2013.01); *H01L 21/32051* (2013.01); *H01L 21/561* (2013.01); *H01L 21/6836* (2013.01); *H01L 21/78* (2013.01); *H01L 23/481* (2013.01); *H01L 23/3121* (2013.01); *H01L 2221/68327* (2013.01); *H01L 2221/68381* (2013.01)

(58) Field of Classification Search
CPC ....... H01L 2924/00; H01L 2924/00014; H01L 2224/45139; H01L 2224/48644; H01L 2224/48844
See application file for complete search history.

(56) References Cited

U.S. PATENT DOCUMENTS

2016/0351509 A1* 12/2016 Dang .................... H01L 23/552

OTHER PUBLICATIONS

Lee, Lieng-Huang, "Adhesives, Sealants, and Coatings for Space and Harsh Environments," New York, 1988, Plenum Press, 17 pages.

(Continued)

*Primary Examiner* — Tony Tran
(74) *Attorney, Agent, or Firm* — Withrow & Terranova, P.L.L.C.

(57) ABSTRACT

The present disclosure provides electromagnetic shielding for integrated circuit modules with a module-bottom sealing procedure. First a precursor package with a number of integrated modules is provided. Each integrated module includes a module substrate having a number of module contacts at a bottom surface of the module substrate. A combination of a shielding protective material and a chemical resistant tape is then applied over the bottom surface of the module substrate, such that each module contact is sealed. Next, the precursor package is singulated at each inter-module area to form a number of individual integrated modules. A shielding structure is applied completely over a side surface of each individual integrated module. Herein, the shielding structure is electrically coupled to a ground plane within the module substrate.

19 Claims, 7 Drawing Sheets

Figure 1:
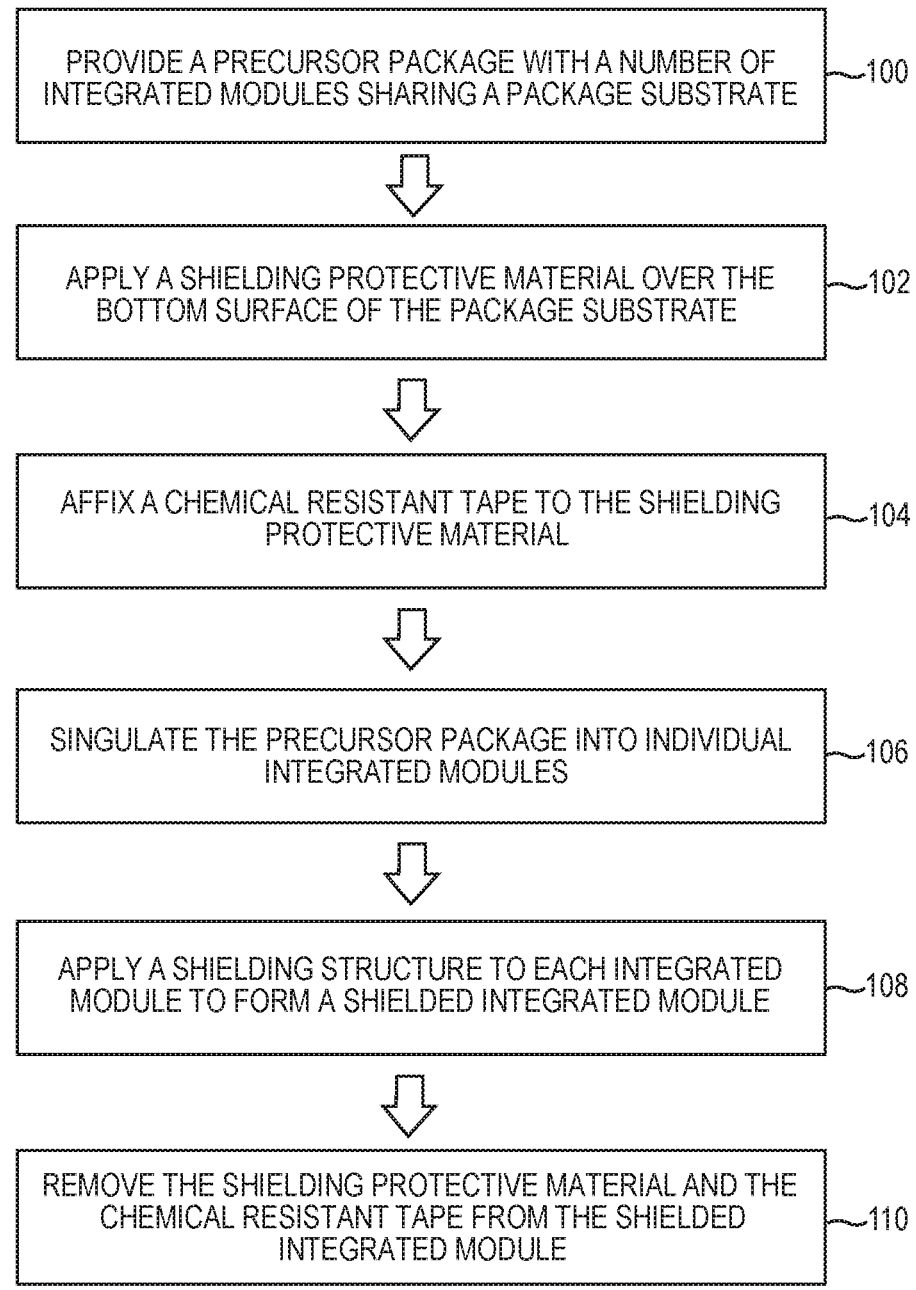

(51) Int. Cl.
*H01L 21/56* (2006.01)
*H01L 23/31* (2006.01)

(56) References Cited

OTHER PUBLICATIONS

Traeger, Richard, "Nonhermeticity of Polymeric Lid Sealants," IEEE Transactions on Parts, Hybrids, and Packaging, vol. 13, Issue 2, Jun. 1977, pp. 147-152.

* cited by examiner

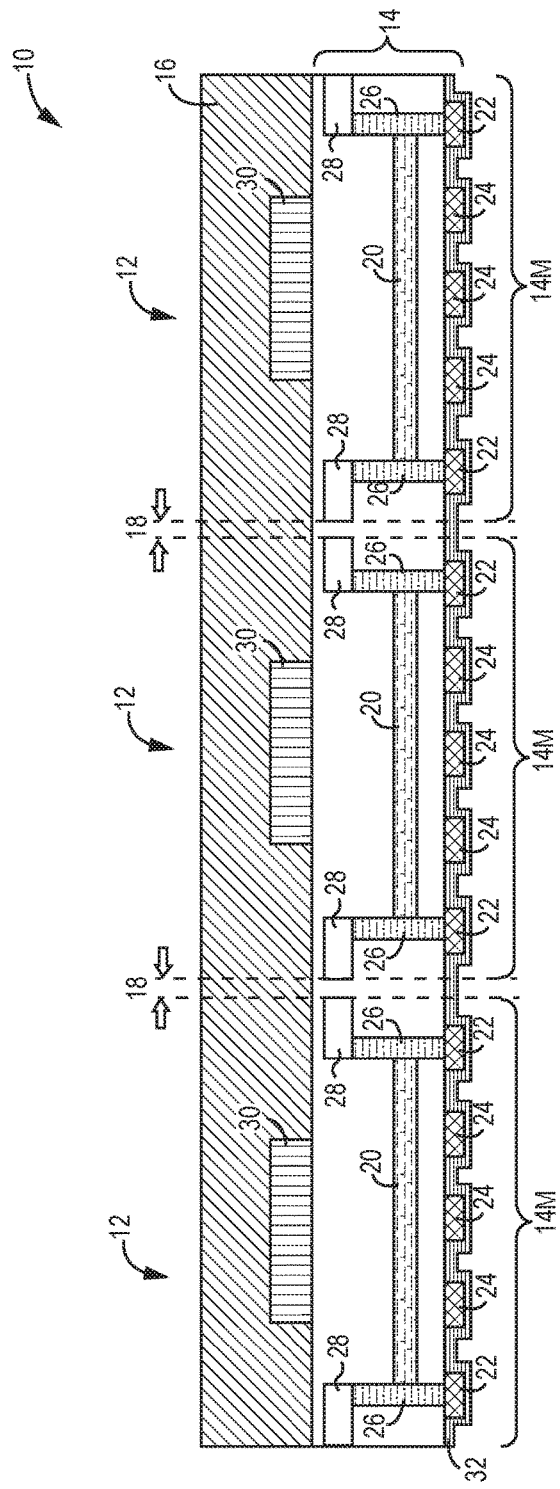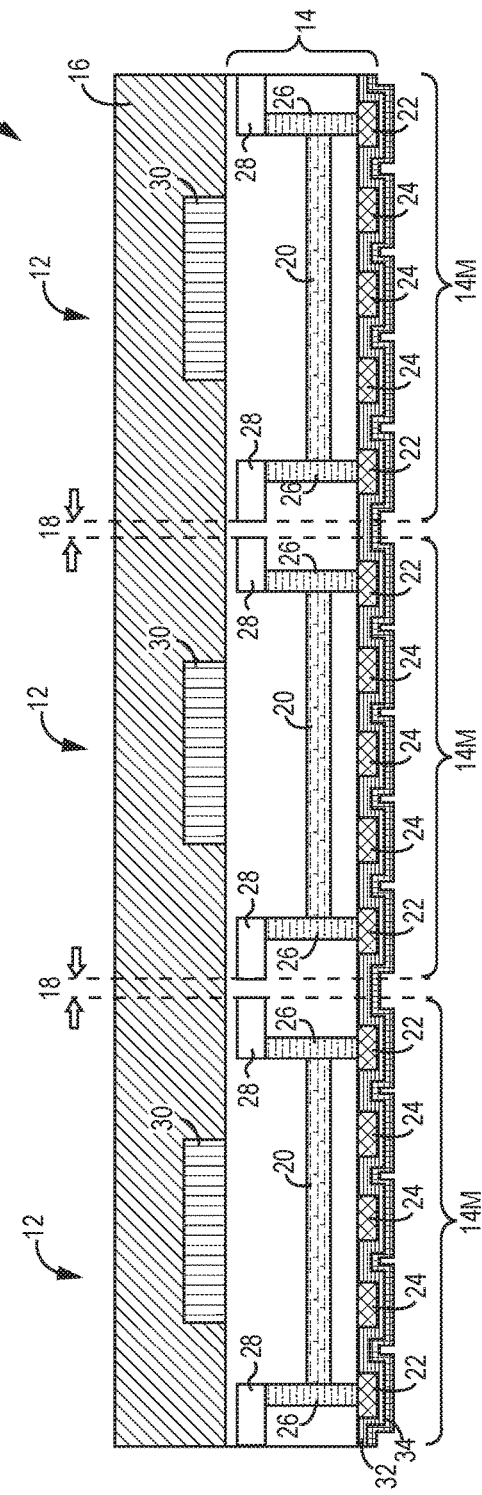

ELECTROMAGNETIC SHIELDING FOR INTEGRATED CIRCUIT MODULES

RELATED APPLICATIONS

This application claims the benefit of provisional patent application Ser. No. 62/447,104, filed Jan. 17, 2017, the disclosure of which is hereby incorporated herein by reference in its entirety.

FIELD OF THE DISCLOSURE

The present disclosure relates to providing electromagnetic shielding for integrated circuit modules, and more particularly to providing electromagnetic shielding for integrated circuit modules with a module-bottom sealing procedure.

BACKGROUND

Electronic components have become ubiquitous in modern society. The electronics industry proudly, but routinely, announces accelerated clocking speeds and smaller integrated circuit modules. While the benefits of these devices are myriad, smaller and faster electronic devices create problems. In particular, high clock speeds inherently require fast transitions between signal levels. Fast transitions between signal levels create electromagnetic emissions throughout the electromagnetic spectrum. Such emissions are regulated by the Federal Communications Commission (FCC) and other regulatory agencies. Furthermore, fast speed inherently means higher frequencies. Higher frequencies mean shorter wavelengths. Shorter wavelengths mean shorter conductive elements act as antennas to broadcast these electromagnetic emissions. These electromagnetic emissions radiate from a source and may impinge upon other electronic components. If the signal strength of the emission at the impinged upon electronic component is high enough, the emission may interfere with the operation of the impinged upon electronic component. This phenomenon is sometimes called electromagnetic interference (EMI) or crosstalk. Dealing with EMI and crosstalk is sometimes referred to as electromagnetic compatibility (EMC). Other components, such as transceiver modules, inherently have lots of radiating elements that raise EMI concerns. Thus, even electronic modules that do not have high clock speeds may have EMI issues.

One way to reduce EMI is to shield the integrated circuit modules that cause EMI or that are sensitive to EMI. Typically the shield is formed from a grounded conductive material that covers the top and at least a portion of the side of one circuit module. When electromagnetic emissions from the circuit module strike the interior surface of the conductive material, the electromagnetic emissions are electrically shorted through the grounded conductive material, thereby reducing emissions. Likewise, when emissions from another radiating element strike the exterior surface of the conductive material, a similar electrical short occurs, and the module does not suffer EMI from other modules.

However, if the shield fully covers the side of the circuit module, there is a high possibility that the shield may attack the electrical contacts located at the periphery of the bottom of the circuit module. Alternatively, if the shield only partially covers the side of the circuit module, there are potential escape points for the electromagnetic field (EMF), which may result in decreased shield effectiveness. Thus, there is a need for an improved procedure that allows the shield to fully cover the side of the circuit module to effectively deal with EMI concerns, and does not impact the electrical contacts of the circuit module. In addition, cost effectiveness is desired.

SUMMARY

The present disclosure relates to providing electromagnetic shielding for integrated circuit modules with a module-bottom sealing procedure. According to an exemplary process, a precursor package having a number of integrated modules is first provided. Herein, an inter-module area is horizontally in between two adjacent integrated modules. Each integrated module includes a module substrate with a ground plane and at least one electronic component attached to a top surface of the module substrate and encapsulated by a mold compound. The module substrate includes a number of first module contacts formed at a bottom surface of the module substrate. Next, a shielding protective material is applied over the bottom surface of the module substrate, such that each first module contact is sealed. A chemical resistant tape is then affixed to the shielding protective material. The precursor package is singulated at each inter-module area to form a number of individual integrated modules. After the shielding protective material and the chemical resistant tape are applied and the precursor package is singulated, a shielding structure is applied completely over a side surface of each individual integrated module and applied at least partially over a top surface of each individual integrated module. The shielding structure is electrically coupled to the ground plane within the corresponding module substrate. Lastly, the chemical resistant tape and the shielding protective material are removed to expose each first module contact.

In one embodiment of the exemplary process, the shielding structure is applied completely over the top surface of each individual integrated module.

In one embodiment of the exemplary process, the module substrate further includes at least one conductive element electrically coupled to the ground plane. Herein, the at least one conductive element is positioned at a periphery of the module substrate and adjacent to an edge of a corresponding inter-module area, such that the at least one conductive element is exposed during singulating the precursor package at each inter-module area and in contact with the shielding structure.

In one embodiment of the exemplary process, the at least one conductive element is electrically coupled to the ground plane by via structures.

In one embodiment of the exemplary process, the module substrate further includes a number of second module contacts formed at the bottom surface of the module substrate and sealed by the shielding protective material. Herein, each first module contact is electrically coupled to the ground plane and electrically isolated from the second module contacts.

In one embodiment of the exemplary process, the first module contact is electrically coupled to the ground plane by via structures.

In one embodiment of the exemplary process, the precursor package is singulated after applying the shielding protective material and affixing the chemical resistant tape to the shielding protective material.

In one embodiment of the exemplary process, the precursor package is singulated before applying the shielding protective material and affixing the chemical resistant tape to the shielding protective material.

In one embodiment of the exemplary process, the shielding protective material completely covers the bottom surface of each module substrate and the chemical resistant tape completely covers the shielding protective material.

In one embodiment of the exemplary process, the shielding protective material is a liquid material, which ensures essentially no leakage onto the bottom surface of each module substrate.

In one embodiment of the exemplary process, the shielding protective material is formed of one of acrylic resin, silicon resin, and coated polymeric materials.

In one embodiment of the exemplary process, the chemical resistant tape is a pressure sensitive adhesive (PSA) tape.

In one embodiment of the exemplary process, the bottom surface of each individual integrated module is not covered by the shielding structure.

In one embodiment of the exemplary process, the shielding structure includes a first layer and a second layer. The first layer completely covers the side surface of each individual integrated module and at least partially covers the top surface of each individual integrated module. The second layer is over the first layer. Herein, the first layer is formed of copper, aluminum, silver, or gold and the second layer is formed of nickel.

In one embodiment of the exemplary process, the first layer is formed by an electroless plating process and the second layer is formed by at least one of an electroless plating process and an electrolytic plating process.

In one embodiment of the exemplary process, the first layer is formed by an electroless plating process and an electrolytic plating process, and the second layer is formed by at least one of an electroless plating process and an electrolytic plating process.

In one embodiment of the exemplary process, a thickness of the first layer is between 2 µm and 16 µm, and a thickness of the second layer is between 0.75 µm and 3 µm.

In one embodiment of the exemplary process, the first module contacts are conductive and formed by a land grid array (LGA) method.

In one embodiment of the exemplary process, the at least one electronic component is at least one of a flip-chip die, a wire-bonding die, a surface mounted device (SMD), and an inductor.

In one embodiment of the exemplary process, each module substrate is formed from a common printed circuit board (PCB).

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 1 provides a flow diagram that illustrates an exemplary electromagnetic shielding process according to one embodiment of the present disclosure.

FIGS. 2-7 provide exemplary steps associated with the electromagnetic shielding process provided in FIG. 1.

It will be understood that for clear illustrations, FIGS. 1-7 may not be drawn to scale.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The present disclosure relates to a method to provide electromagnetic shielding for integrated circuit modules with a module-bottom sealing procedure. FIG. 1 provides a flow diagram that illustrates an exemplary electromagnetic shielding process according to one embodiment of the present disclosure. FIGS. 2-7 provide exemplary steps associated with the electromagnetic shielding process provided in FIG. 1. Although the exemplary steps are illustrated in a series, the exemplary steps are not necessarily order dependent. Some steps may be done in a different order than that presented. Further, processes within the scope of this disclosure may include fewer or more steps than those illustrated in FIGS. 2-7.

Figure 2:
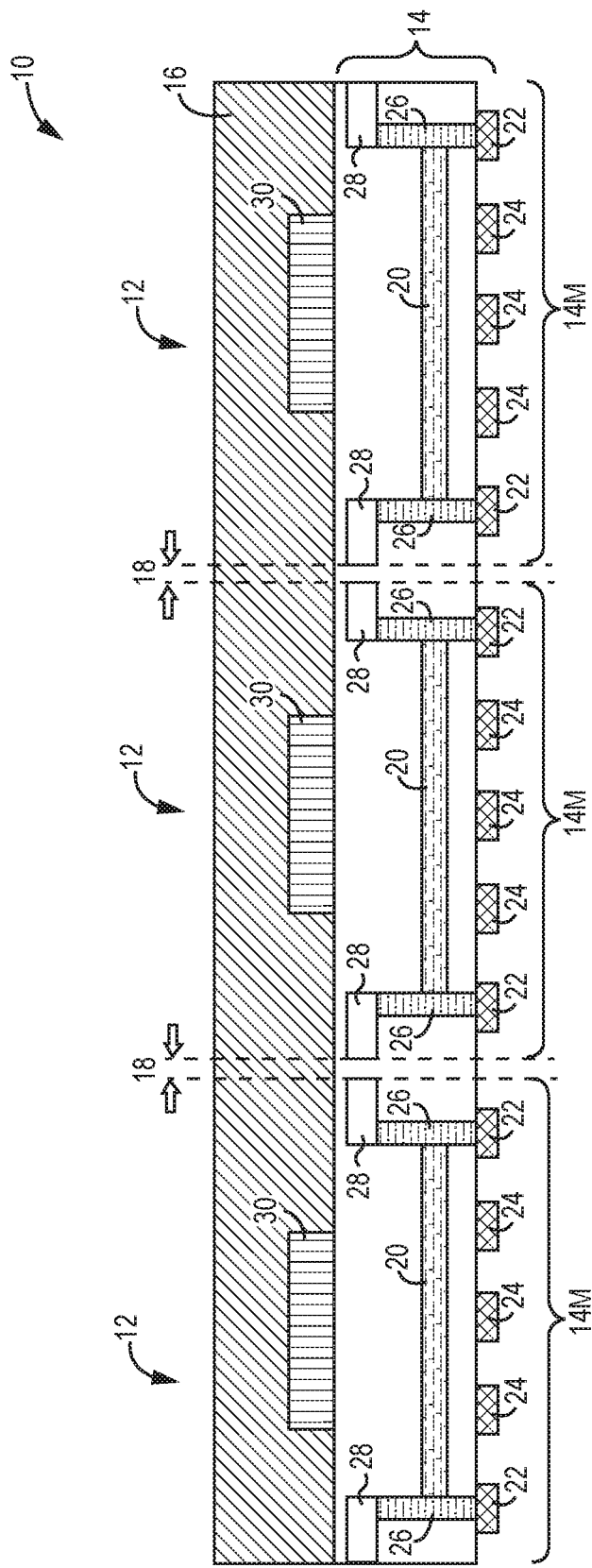

Initially, a precursor package 10 with a number of integrated modules 12 is provided as depicted in FIG. 2 (Step 100). For the purpose of this illustration, the precursor package 10 includes three integrated modules 12 sharing a package substrate 14 and a mold compound 16. In different applications, the precursor package 10 may include fewer or more integrated modules 12. Herein, the package substrate 14 may be a laminate, such as a printed circuit board (PCB), having a number of laminate layers (not shown for clarity). These laminate layers of the package substrate 14 may include prepreg material. The mold compound 16 resides over a top surface of the package substrate 14 and may be an organic epoxy resin system.

Further, the package substrate 14 may be divided into a number of module substrates 14M, and a number of inter-module areas 18. Each module substrate 14M corresponds to one integrated module 12, and each inter-module area 18 has a small width and is horizontally in between adjacent module substrates 14M. Herein, each module substrate 14M includes a ground plane 20, a number of first module contacts 22, a number of second module contacts 24, a number of via structures 26, and a number of conductive elements 28. The ground plane 20 is in an interior portion of the corresponding module substrate 14M. The ground plane 20 for each module substrate 14M may be formed from a common ground plane (not shown). The first module contacts 22 and the second module contacts 24 are formed at a bottom surface of the corresponding module substrate 14M, and do not reside underneath any inter-module area 18. The first module contacts 22 and the second module contacts 24 are conductive and may be metal pads formed by a land grid array (LGA) method. The first module contacts 22 are used for grounded signals and may be coupled to the ground plane 20 by via structures 26. The second module contacts 24 are used for non-grounded signals and electrically isolated from the first module contacts 22. If the package substrate 14 is a PCB, there may be a solder mask (not shown) at the bottom surface of the package substrate 14. Each first/second module contact 22/24 may be formed by a copper pad with gold plating that is exposed through the solder mask. In addition, each conductive element 28 is positioned at a periphery of the module substrate 14M, such that each conductive element 28 is adjacent to an edge of one inter-module area 18 or exposed through a side surface of the package substrate 14. As used herein, the term "periphery" is defined to be the outermost part or region within a precise boundary, in particular, the boundary formed by the side surface of the module substrate 14M. The conductive elements 28 may be electrically coupled to the ground plane 20 by via structures 26.

Besides the module substrate 14M, each integrated module 12 also includes an electronic component 30 and a portion of the mold compound 16. The electronic component 30 is attached to a top surface of the corresponding module substrate 14M and does not reside on any inter-module area 18. The portion of the mold compound 16 resides over the top surface of the corresponding module substrate 14M and encapsulates the electronic component 30. In different applications, each integrated module 12 may include multiple electronic components. The electronic component 30 may be a flip-chip die, a wire-bonding die, a surface mounted device (SMD), an inductor, or other active/passive component.

In this embodiment, a top surface of the precursor package 10 is a top surface of the mold compound 16, a bottom surface of the precursor package 10 is a bottom surface of the package substrate 14, and a side surface of the precursor package 10 is a combination of a side surface of the mold compound 16 and a side surface of the package substrate 14.

Next, a shielding protective material 32 is applied over the bottom surface of the package substrate 14 and seals each first module contact 22 and each second module contact 24, as depicted in FIG. 3 (Step 102). Applying the shielding protective material 32 over the bottom surface of the package substrate 14 equals applying the shielding protective material 32 over each module substrate 14M and each inter-module area 18 continuously. In one embodiment, the shielding protective material 32 completely covers the bottom surface of the package substrate 14 (completely covers the bottom surface of each module substrate 14M) and does not cover any portion of the side surface of the precursor package 10. Herein and hereafter, completely covering a surface refers to covering at least 99% of that surface. The shielding protective material 32 is a liquid material, which provides superior attachment to the bottom surface of the package substrate 14 and prevents any leakage onto the bottom surface of the package substrate 14, such as acrylic resin, silicon resin, or other coated polymeric materials.

A chemical resistant tape 34 is then affixed to the shielding protective material 32 as depicted in FIG. 4 (Step 104). In one embodiment, the chemical resistant tape 34 completely covers the shielding protective material 32 and does not cover any portion of the side surface of the precursor package 10. The chemical resistant tape 34 is a solid tape, such as a pressure sensitive adhesive (PSA) tape, other adhesive coated films or a film acting as an adhesive. The purpose of the combination of the shielding protective material 32 and the chemical resistant tape 34 is to prevent potential damage to the first/second module contacts 22/24 in a subsequent shielding step. The shielding protective material 32 has a superior sealing feature, which ensures essentially no leakage onto the bottom surface of the package substrate 14, but may not withstand strong chemical chemistries. The chemical resistant tape 34 may withstand various chemical chemistries, but may not provide superior sealing for the first module contacts 22 or the second module contacts 24, since the bottom surface of the package substrate 14 is not even. The combination of the shielding protective material 32 and the chemical resistant tape 34 may withstand various chemical chemistries and permit minimal to no leakage onto the bottom surface of the package substrate 14 during the subsequent shielding step. If there is a small amount of leakage observed with the chemical resistant tape 34, the small amount of leakage will face the obstruction of the shielding protective material 32.

Figure 5:
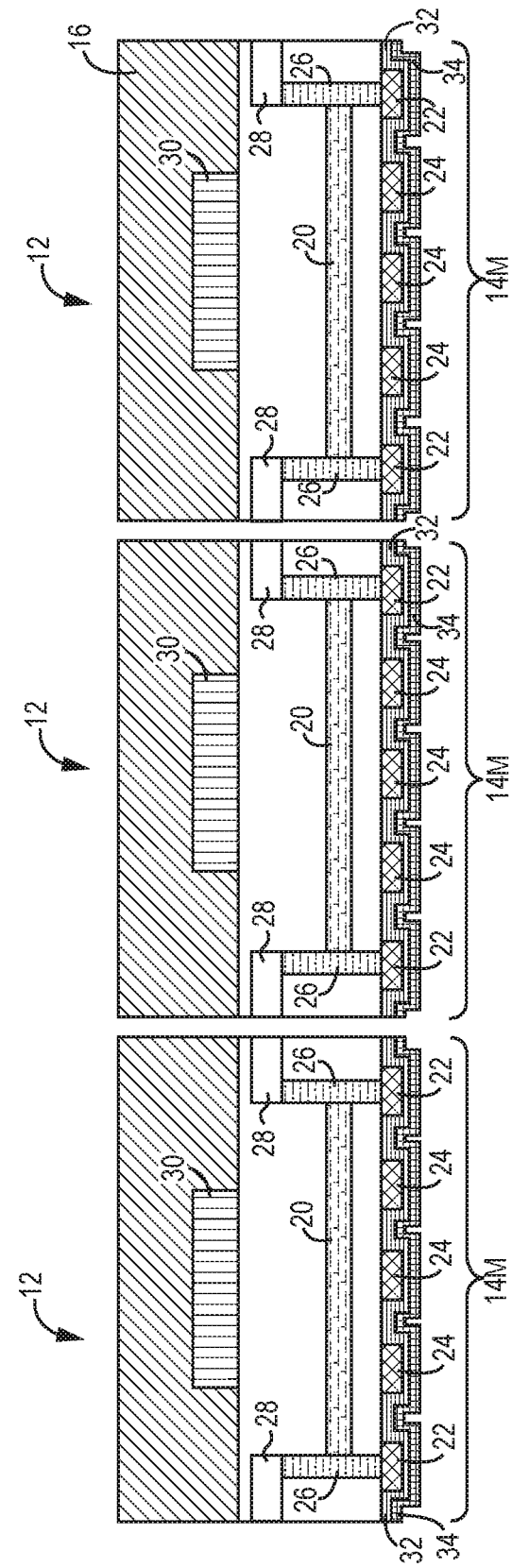

After the shielding protective material 32 and the chemical resistant tape 34 are applied, the precursor package 10 is then singulated at each inter-module area 18 into individual integrated modules 12, as depicted in FIG. 5 (step 106). The singulation of the precursor package 10 is achieved by removing a portion of the precursor package 10 at each inter-module area 18. Each removed portion of the precursor package 10 includes a portion of the package substrate 14 and a portion of the mold compound 16. Each removed portion of the precursor package 10 has a width that is wider than or equal to the width of the inter-module area 18, such that the conductive elements 28 adjacent to the edge of any inter-module area 18 are exposed through the side surface of the module substrate 14M. In addition, each removed portion of the precursor package 10 is not too wide to expose the first and/or the second module contact 22 and/or 24 that is close to the inter-module area 18. Herein, a top surface of one integrated module 12 is a top surface of a corresponding portion of the mold compound 16, a bottom surface of the integrated module 12 is a bottom surface of a corresponding module substrate 14M, and a side surface of the integrated module 12 is a combination of a side surface of the corresponding portion of mold compound 16 and a side surface of the corresponding module substrate 14M. Each first module contact 22 and each second module contact 24 of each integrated module 12 remain sealed by the combination of the shielding protective material 32 and chemical resistant tape 34. In one embodiment, the combination of the shielding protective material 32 and the chemical resistant tape 34 completely covers the bottom surface of each module substrate 14M and does not cover any portion of the side surface of each integrated module 12.

In different applications, the singulation of the precursor package 10 may be accomplished before the combination of the shielding protective material 32 and the chemical resistant tape 34 are applied over the bottom surface of the package substrate 14. Alternatively, the combination of the shielding protective material 32 and chemical resistant tape 34 is applied to the bottom surface of each module substrate 14M of each integrated module 12 after the singulation of the precursor package 10.

Figure 6A:
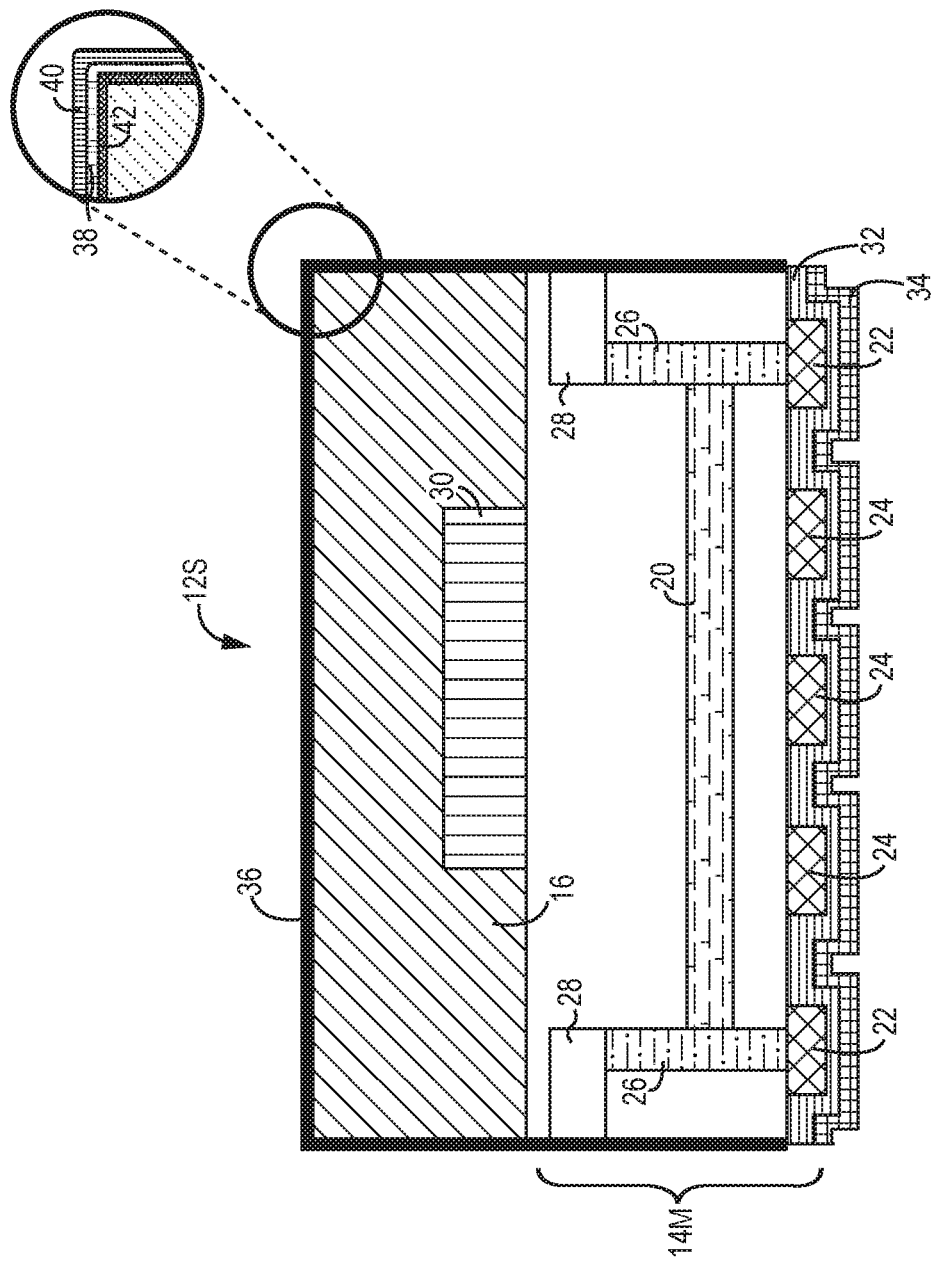

After the singulation procedure is completed, a shielding structure 36 is applied to each integrated module 12 to form a shielded integrated module 12S, as depicted in FIG. 6A (Step 108). The shielding structure 36 completely covers the top surface and the side surface of each integrated module 12, while the bottom surface of each integrated module 12 is not covered by the shielding structure 36. Herein, completely covering a surface refers to covering at least 99% of the surface. Since each conductive element 28 is exposed through the side surface of the corresponding module substrate 14M, the shielding structure 36 is in direct contact with each conductive element 28. As such, the shielding structure 36 may be electrically coupled to the ground plane 20 through the conductive elements 28 and the via structures 26.

The shielding structure 36 includes at least a first layer 38 and a second layer 40. The first layer 38 completely covers the top surface and the side surface of the integrated module 12, and may be formed of copper, aluminum, silver, gold, or other conductive materials with a thickness between 2 µm and 16 µm. In one embodiment, the first layer 38 may be formed by an electroless plating process. In another embodiment, the first layer 38 may be formed by an electroless plating process and an electrolytic plating process. The second layer 40 resides over the first layer 38, and may be formed of nickel with a thickness between 0.75 µm and 3 µm. The second layer 40 may be formed by at least one of an electroless plating process and an electrolytic plating process. In order to achieve a superior adhesion, the shielding structure 36 may further include a seed layer 42 formed of copper, aluminum, silver, gold, or other conductive materials with a thickness between 0.5 µm and 1.5 µm. The seed layer 42 may directly and completely cover the top surface and the side surface of the integrated module 12, and the first layer 38 resides over the seed layer 42. The seed layer 42 may be formed by at least one of an electroless plating process and an electrolytic plating process.

Due to the protection from the combination of the shielding protective material 32 and the chemical resistant tape 34, the first module contacts 22 and the second module contacts 24 (especially the first/second module contacts 22/24 close to the side surface of the module substrate 14M) will not be affected during the shielding step. The chemical resistant tape 34 withstands various chemical chemistries during the shielding step. If there is a small amount of leakage observed with the chemical resistant tape 34, the small amount of leakage will face the obstruction of the shielding protective material 32.

Figure 6B:
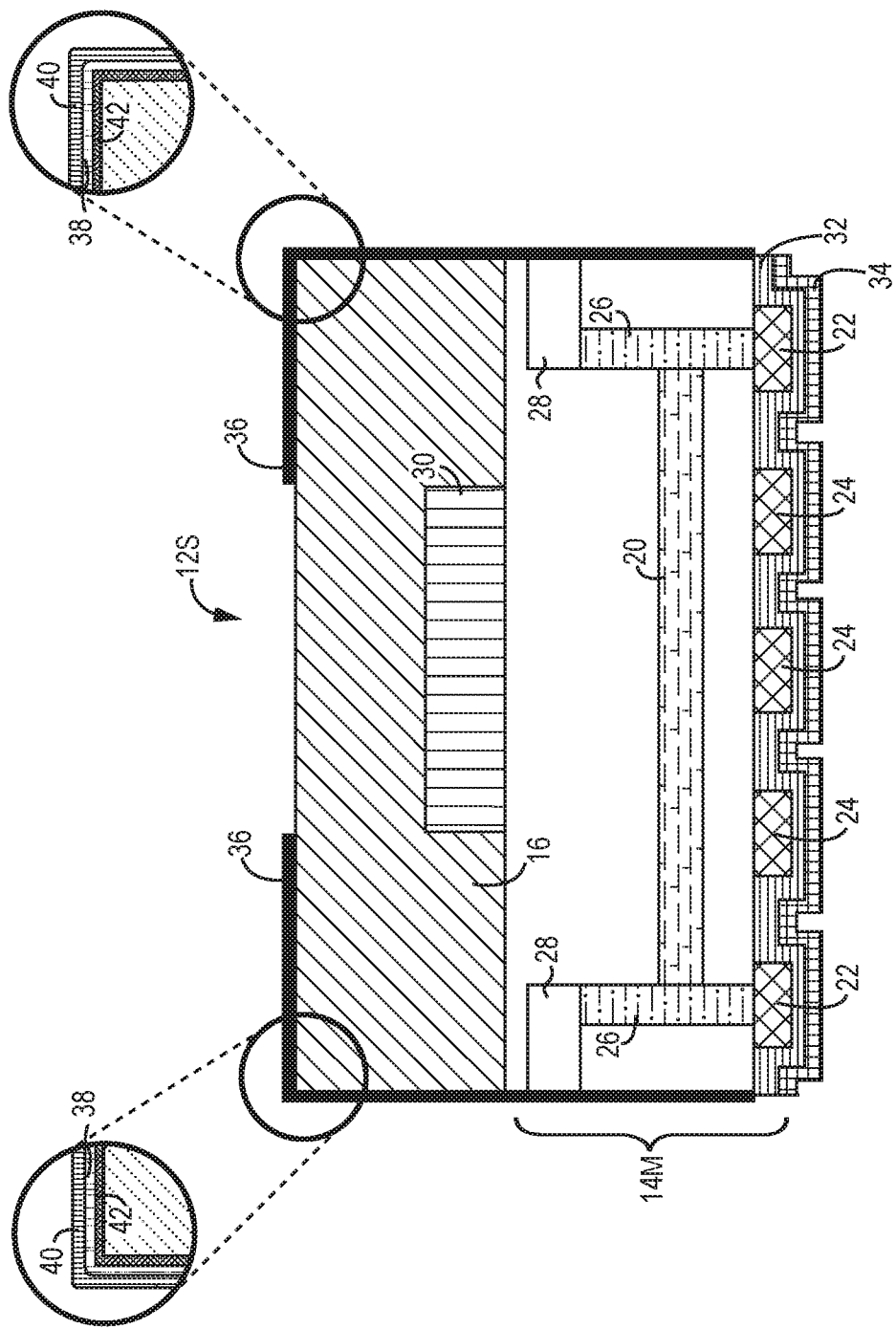

In another embodiment, the shielding structure 36 may not cover the top surface of each integrated module 12 completely, as depicted in FIG. 6B. Herein, the shielding structure 36 completely covers the side surface of each integrated module 12, partially covers the top surface of each integrated module 12, and does not cover the bottom surface of each integrated module 12. Accordingly, the first layer 38 completely covers the side surface of each integrated module 12, partially covers the top surface of each integrated module 12, and does not cover the bottom surface of each integrated module 12. The second layer 40 resides over the first layer 38.

Figure 7:
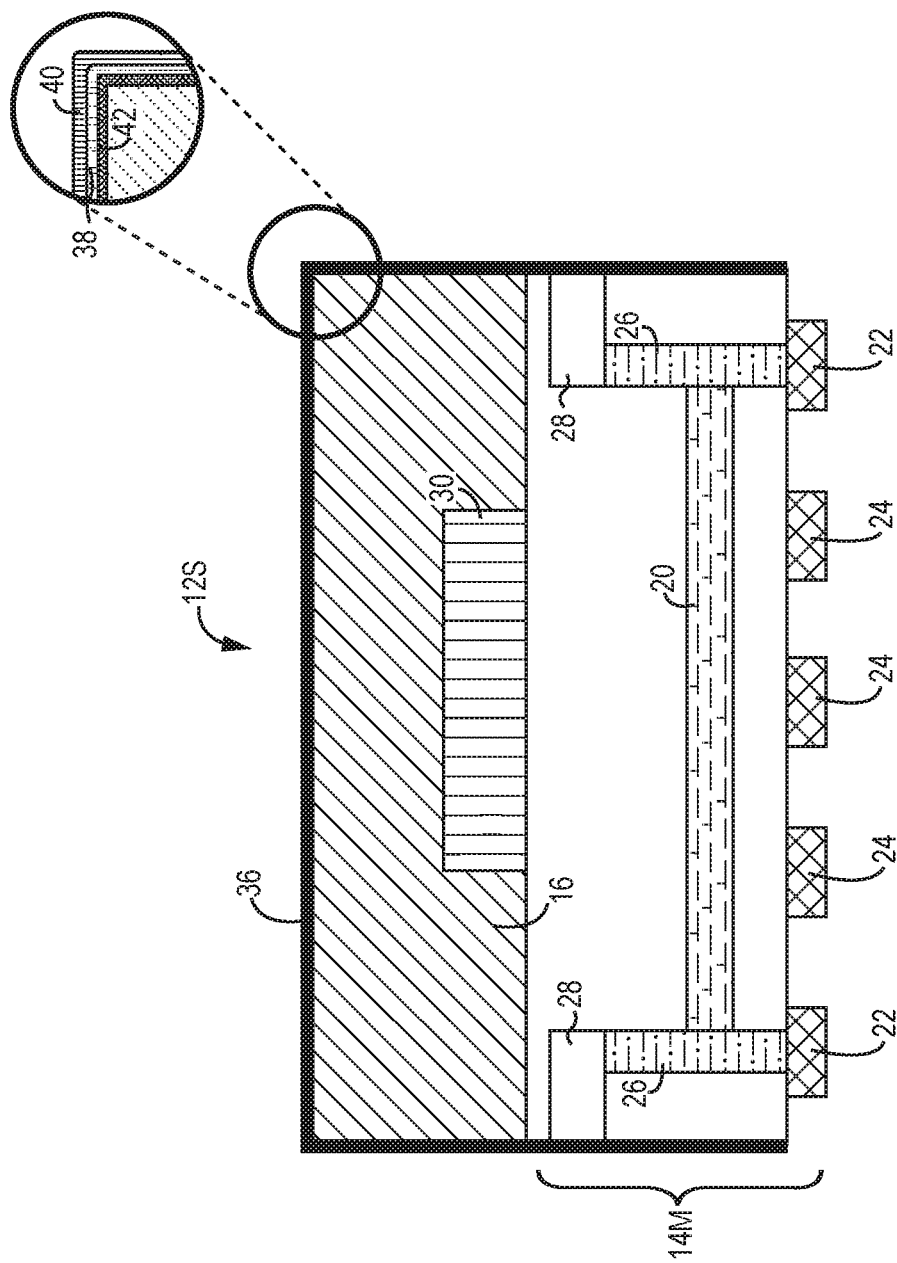

Finally, the combination of the shielding protective material 32 and chemical resistant tape 34 is removed from each shield integrated module 12S to expose the first module contacts 22 and the second module contacts 24, as depicted in FIG. 7 (step 110). In one embodiment, the removing process is provided by stripping off the shielding protective material 32. The chemical resistant tape 34 affixed to the shielding protective material 32 may be removed at the same time. Herein, the shielding structure 36 still completely covers the side surface of the shielded integrated module 12S and at least partially covers the top surface of the shielded integrated module 12S. The shielding structure 36 remains electrically coupled to the ground plane 20. In another embodiment, the removing process begins with removing the chemical resistant tape 34 and then removing the shielding protective material 32.

Those skilled in the art will recognize improvements and modifications to the preferred embodiments of the present disclosure. All such improvements and modifications are considered within the scope of the concepts disclosed herein and the claims that follow.

What is claimed is:

1. A method comprising is sequence order:
   providing a precursor package having a plurality of integrated modules, wherein:
     an inter-module area is horizontally in between two adjacent integrated modules of the plurality of integrated modules; and
     each of the plurality of integrated modules comprises a module substrate with a ground plane and at least one electronic component attached to a top surface of the module substrate and encapsulated by a mold compound, wherein the module substrate comprises a plurality of first module contacts formed at a bottom surface of the module substrate;

applying a shielding protective material over the bottom surface of the module substrate, such that each of the plurality of first module contacts is sealed;

affixing a chemical resistant tape to the shielding protective material;

singulating the precursor package at each inter-module area to form a plurality of individual integrated modules, wherein each integrated module in the plurality of individual integrated modules is separate from one another;

applying a shielding structure comprising a first layer and a second layer, wherein:
 the first layer completely covers sides of each of the plurality of individual integrated modules and at least partially covers a top surface of each of the plurality of individual integrated modules;
 the second layer covers the first layer;
 the first layer is formed of copper, aluminum, silver, or gold, and the second layer is formed of nickel;
 the sides of each of the plurality of individual integrated modules include sides of a corresponding module substrate; and
 the shielding structure is electrically coupled to the ground plane within the corresponding module substrate; and removing the chemical resistant tape and the shielding protective material to expose each of the plurality of first module contacts.

2. The method of claim 1 wherein the module substrate further comprises at least one conductive element electrically coupled to the ground plane, wherein the at least one conductive element is positioned at a periphery of the module substrate and adjacent to an edge of a corresponding inter-module area, such that the at least one conductive element is exposed during singulating the precursor package at each inter-module area and in contact with the shielding structure.

3. The method of claim 2 wherein the at least one conductive element is electrically coupled to the ground plane by via structures.

4. The method of claim 1 wherein the module substrate further comprises a plurality of second module contacts formed at the bottom surface of the module substrate and sealed by the shielding protective material, wherein each of the plurality of first module contacts is electrically coupled to the ground plane and electrically isolated from the plurality of second module contacts.

5. The method of claim 4 wherein the plurality of first module contacts is electrically coupled to the ground plane by via structures.

6. The method of claim 1 wherein the shielding protective material completely covers the bottom surface of each module substrate and the chemical resistant tape completely covers the shielding protective material.

7. The method of claim 6 wherein the shielding protective material is a liquid material, which ensures essentially no leakage onto the bottom surface of each module substrate.

8. The method of claim 7 wherein the shielding protective material is formed of one of a group consisting of acrylic resin, silicon resin and coated polymeric materials.

9. The method of claim 6 wherein the chemical resistant tape is a pressure sensitive adhesive (PSA) tape.

10. The method of claim 1 wherein the bottom surface of each of the plurality of individual integrated modules is not covered by the shielding structure.

11. The method of claim 1 wherein the first layer is formed by an electroless plating process and the second layer is formed by at least one of an electroless plating process and an electrolytic plating process.

12. The method of claim 1 wherein the first layer is formed by an electroless plating process and an electrolytic plating process, and the second layer is formed by at least one of an electroless plating process and an electrolytic plating process.

13. The method of claim 1 wherein a thickness of the first layer is between 2 μm and 16 μm.

14. The method of claim 1 wherein a thickness of the second layer is between 0.75 μm and 3 μm.

15. The method of claim 1 wherein the plurality of first module contacts is conductive and formed by a land grid array (LGA) method.

16. The method of claim 1 wherein the at least one electronic component is at least one of a group consisting of a flip-chip die, a wire-bonding die, a surface mounted device (SMD), and an inductor.

17. The method of claim 1 wherein each module substrate is formed from a common printed circuit board (PCB).

18. The method of claim 1 wherein the shielding structure is applied completely over the top surface of each of the plurality of individual integrated modules.

19. A method comprising in sequence order:
 providing a precursor package having a plurality of integrated modules, wherein:
  an inter-module area is horizontally in between two adjacent integrated modules of the plurality of integrated modules; and
  each of the plurality of integrated modules comprises a module substrate with a ground plane and at least one electronic component attached to a top surface of the module substrate and encapsulated by a mold compound, wherein the module substrate comprises a plurality of first module contacts formed at a bottom surface of the module substrate;
 singulating the precursor package at each inter-module area to form a plurality of individual integrated modules;
 applying a shielding protective material over the bottom surface of each module substrate, such that each of the plurality of first module contacts is sealed;
 affixing a chemical resistant tape to the shielding protective material;
 applying a shielding structure comprising a first layer and a second layer, wherein:
  the first layer completely covers sides of each of the plurality of individual integrated modules and at least partially covers a top surface of each of the plurality of individual integrated modules;
  the second layer covers the first layer;
  the first layer is formed of copper, aluminum, silver, or gold, and the second layer is formed of nickel;
  the sides of each of the plurality of individual integrated modules include sides of a corresponding module substrate; and
  the shielding structure is electrically coupled to the ground plane within the corresponding module substrate; and removing the chemical resistant tape and the shielding protective material to expose each of the plurality of first module contacts.

\* \* \* \* \*

UNITED STATES PATENT AND TRADEMARK OFFICE
CERTIFICATE OF CORRECTION

PATENT NO. : 10,553,545 B2  
APPLICATION NO. : 15/825948  
DATED : February 4, 2020  
INVENTOR(S) : Donald Joseph Leahy et al.

Page 1 of 1

It is certified that error appears in the above-identified patent and that said Letters Patent is hereby corrected as shown below:

In the Claims

In Column 8, Line 59, Claim 1, replace "A method comprising is sequence order:" with --A method comprising in sequence order:--.

Signed and Sealed this  
Thirty-first Day of March, 2020

Andrei Iancu  
*Director of the United States Patent and Trademark Office*